United States Patent [19]

Kinney et al.

[11] 3,934,503

[45] Jan. 27, 1976

[54] STENCIL SCREENS

[75] Inventors: Layton C. Kinney, Chicago; Edwin H. Tompkins, Riverside, both of Ill.

[73] Assignee: IIT Research Institute, Chicago, Ill.

[22] Filed: Dec. 10, 1968

[21] Appl. No.: 782,666

Related U.S. Application Data

[63] Continuation-in-part of Ser. No. 648,861, June 26, 1967, abandoned, which is a continuation-in-part of Ser. No. 457,658, May 21, 1965, abandoned.

[52] U.S. Cl. ............ 101/128.2; 101/128.4; 96/36.4; 427/143
[51] Int. Cl.² .......................................... B41W 1/24
[58] Field of Search ..... 117/35.5; 101/128.2, 128.4; 96/36.4; 427/143

[56] References Cited
UNITED STATES PATENTS

| | | | |
|---|---|---|---|
| 2,040,142 | 5/1936 | Koreska et al. | 117/35.5 |
| 2,500,617 | 3/1950 | Meigs | 101/128.2 |
| 2,664,043 | 12/1953 | Dalton | 101/128.2 |
| 2,808,777 | 10/1957 | Roshkind et al. | 101/128.2 |
| 3,113,511 | 10/1963 | Dalton | 101/128.2 X |
| 3,283,704 | 11/1966 | Dalton | 101/128.4 X |
| 3,509,088 | 4/1970 | Dalton | 101/128.2 X |

*Primary Examiner*—David Klein
*Attorney, Agent, or Firm*—Robert E. Wagner

[57] ABSTRACT

A blank for forming a stencil screen for silk screen or electrostatic stencil printing is disclosed. The screen includes a resilient, high tensile strength, porous substrate such as a monofilamentary nylon or stainless steel 200-mesh screen. A light radiation absorbent, self-combustible, ink-resistant, ink-impervious and tough film is applied to the screen, suitably a combustible black nitrocellulose film or a black cellulose ether film containing finely dispersed nitrate or perchlorate. The film is selectively removed by directly pulsing high-intensity light of over 10 joules per square inch for a short duration of 1 to 50 milliseconds in the form of an image pattern to ignite and completely combust the film only in said areas during the duration of the pulse.

6 Claims, 5 Drawing Figures

*INVENTOR.*
LAYTON C. KINNEY
EDWIN H. TOMPKINS
BY *Lindenberg & Freilich*
ATTORNEYS.

STENCIL SCREENS

CROSS REFERENCES TO RELATED APPLICATIONS

This application is a continuation-in-part of an application Ser. No. 648,861 filed June 26, 1967, now abandoned, which in turn is a continuation-in-part of an application Ser. No. 457,658 filed May 21, 1965, now abandoned.

BACKGROUND OF THE INVENTION

1. Field of the Invention:

The present invention relates to printing devices, and more particularly, to a novel stencil screen and to methods and means for its manufacture and use.

2. Description of the Prior Art:

In screen printing, a stencil is prepared on a porous base having mesh openings of a size sufficient to pass liquid or solid toner particles to a surface to be copied. The non-image areas of the screen are blocked with a suitable ink-impervious material in a pattern corresponding to a negative of the open image printing pattern. Ink is applied to the screen and is directly transferred to the substrate through the porous base or may be accelerated to the substrate by electrostatic forces. The use of a metal screen in the case of an electrostatic printing process, such as described in U.S. Pat. No. 3,081,698, Childress et al, enables one to utilize the stencil screen as one electrode of the electrostatic field for accelerating the toner to the substrate.

There are three principal methods of commercially preparing the stencil. By far, the most common and popular technique is the so-called "direct process" in which a light-sensitized hydrocolloid, for example, gelatin or polyvinyl alcohol, is coated directly onto the mesh by means of a reservoir-type coater. After the coating is dried, a second coating is applied in a similar manner to avoid pinholes. Though the coating is simple to apply, it is rather slow-drying, and the use of higher temperatures can cause bubbling or premature hardening of the colloid.

The stencil is prepared by exposing the colloid selectively to an arc lamp which tans and hardens the illuminated areas. The untanned material is removed by washing with water jets at a carefully controlled temperature. This operation is delicate and requires an experienced operator. The screen must be again dried before it is ready for use. The direct process screen has the advantage that the stencil is exposed and developed after the coating is applied to the screen. However, the coating emulsion fills the spaces between the filaments which tend to adjust to a location midway between the front and rear surface. Therefore, the quality of resolution obtainable is limited.

The second process is the so-called "transfer method" in which a presensitized film coating, such as a bichromated polyvinyl alcohol, is similarly exposed and developed while on a support. The residual emulsion is hardened in acetic acid and the developed coating is then transferred to the screen and allowed to dry. Presumably, the coating is somewhat swollen and contracts and adheres to the filaments of the screen. The adhesion to the screen is quite poor, and consequently, multifilament threads, such as silk, are usually utilized. Silk does not perform very well as an electrostatic stencil since the pores between the filaments tend to become clogged quite easily. Again, an extremely skilled operator is required in the transfer method, and it is very easy to wasy away too much of the emulsion in the development step. In fact, whole chunks may break away, destroying the stencil coating. An even more serious problem is the fact that the dimensional tolerances are very difficult to maintain during transfer of the developed stencil to the screen which results in distortions of the image.

The third process is not photographic and is confined to drawing images directly on the stencil and cutting them out or drawing them in a material that is overcoated and leached out. This is called the "Tusche method" and is confined primarily to artists and other highly skilled craftsmen and is utilized to achieve unusual effects by screen printing techniques. The Tusche method has the advantage that a cut-out stencil can be prepared without the requirement of any chemical developing steps. It, of course, suffers a disadvantage that copy cannot be formed as a stencil by direct application of light to the stencil blank.

Thermal reactions have been suggested as a means of forming patterns in stencil surfaces for reproduction by mimeograph or other related techniques. However, the resolution of these thermal images is extremely low with conventional heating sources. The coatings are of a soft and waxy nature and are not adaptable for printing by either electrostatic screen printing or conventional silk screen processes, and furthermore, the substrates are typically formed of randomly oriented fibrous material, such as paper. The openings formed through paper backings are of a non-uniform dimension and, therefore, wet and dry ink particles are not uniformly passed through the backing.

Furthermore, in the silk screen and electrostatic screen processes, it is usually necessary to stretch the screen onto a frame to provide dimensional stability to the image or to bend the frame into an arcuate or curvilinear shape to print on correspondingly shaped objects. The tension in silk screen printing is sufficient to cause the screen to snap back after deflection in wet ink printing. In electrostatic printing, the screen is stretched with at least sufficient tension to resist deflection by the D.C. electrostatic field. This requires the use of a resilient support having a high tensile strength which is not the case with the wide-mesh paper-back stencils utilized in the mimeograph and related arts.

OBJECTS AND SUMMARY OF THE INVENTION

Accordingly, an object of this invention is the provision of a rapid and dry processing technique for the direct production of printing plates, stencil screens and the like having high resolution patterns on ink-pervious, high tensile strength and resilient substrate materials.

A further object of the invention is the provision of stencil screen blanks having ink-impervious films of high abrasion resistance adherent to ink-permeable, high-strength substrate materials, the coating having the property of being readily removable in highly resolved patterns.

Yet another object of the invention is to provide a direct and reliable method of preparing stencil screens for electrostatic or silk screen printing processes.

A still further object of the invention is to provide a method of making printing screens of the type described in which the screens are characterized by simplicity, dependability, long wear life and low cost and which can be prepared with a minimum amount of technical skill and in a minimum amount of time.

These and other objects and many attendant advantages of the invention will become apparent as the description proceeds.

In accordance with this invention, a printing plate screen or the like comprises a sheet of substrate material, such as a porous film or screen which has a plurality of substantially uniform openings extending therethrough from one face to the other to enable the passage of ink therethrough, and applied to one face of said sheet is a film material which is impervious and resistant to ink and blocks all of the passages in said sheet. The sheet material has high tensile strength and resiliency. The coating material has the property of being self-combustible and being completely consumed only in selected areas exposed to high-intensity, short-duration light energy and comprises a readily combustible film-forming binder material, a fuel component, an oxidizer component and a photothermal pigment material. The components of the coating are present in such amounts that the absorptivity of the coating to said high-intensity, short-duration is sufficient to raise the coating to the threshold for ignition and to completely pyrolyze and consume the binding phase of the coating material in said short duration substantially in a pattern corresponding to the projected light without propagating the reaction linearly to any of the adjacent coating material.

To prepare a stencil image, a transparency having areas transparent to said light in a pattern corresponding to the desired image to be printed and having areas opaque to said light in the areas not desired to be printed is interposed between said light sources and said coating, preferably in contact therewith. A high-intensity, short-duration light source, suitably a photoflash lamp, is illuminated to project said light through the light-transmitting areas of said transparency onto said coating. The energy of the light passing through said areas raises the coating to ignition temperature and causes a complete, highly-resolved removal of the coating material in said areas which receive the directly projected light. Since the coating contains its own supply of oxygen, the process can be carried out in vacuum in absence of an external source of oxygen as well as at atmospheric pressure and in the presence of oxygen. There, thus, remains a printing screen which can be utilized with either liquid or powdered ink to form images by passing the ink through said imaged surface to a substrate to form a print.

The invention will now become better understood by reference to the following detailed description when considered in conjunction with the accompanying drawings.

DESCRIPTION OF THE PREFERRED EMBODIMENTS

Figure 1:
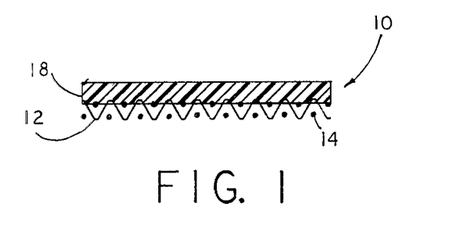
FIG. 1 is a cross-sectional view of a stencil screen blank according to the invention.
Figure 2:
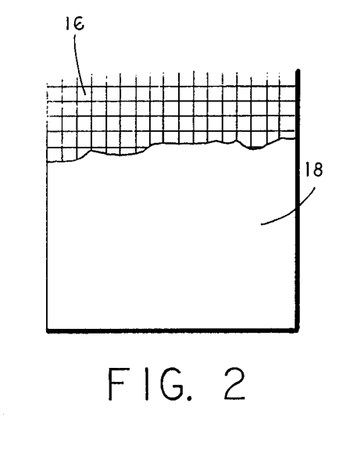
FIG. 2 is a top view of the blank of FIG. 1 partially broken away to illustrate the substrate mesh.

Referring now to FIGS. 1 and 2, a printing plate or screen 10 comprises a substrate 12 in the form of a screen woven of filaments 14 to form a rectangular matrix having openings 16. A coating 18 is applied to one face of this screen so as to block all of the openings thereof.

As discussed previously, the substrate is preferably a material having resiliency and high tensile strength so that it has the ability to be stretched or can be bent to adapt to the requirements of the printing system. Though the screen can be formed of woven multi-filaments, such as silk, it is further preferred that the substrate be formed of monofilamentry material woven into a uniformly sized mesh. The filaments, of course, must be resistant to the components of the ink composition and to the pyrolyzation reaction and are suitably formed of organic polymers such as nylon, a polyamide, or dacron, a polyester, polyethylene or vinyl resins, such as polyvinyl chloride, or a corrosion-resistant metal such as stainless steel.

The mesh size of the woven material is adapted to freely pass the ink droplets or particles and is typically at least 100–400 meshes to the linear inch, though for lower resolution printing, such as printing on a rug or a poster, the mesh openings may be larger. The substrate need not be in woven form and can be prepared by forming evenly spaced and sized openings in a film or sheet, such as by etching holes into a metal or plastic, or by forming the hole pattern by radiation, suitably by pulsing with a collimated laser beam which scans the sheet surface. The thickness of the substrate can be varied widely from 1 to 50 mils in thickness but is preferably from 1 to 20 mils in thickness.

The light-decomposible coating can be essentially characterized as an explosive combustible composition formulated into a film having high tear strength, abrasion resistance and structural strength and having the ability to ignite explosively when directly pulsed with a very short and highly intense pulse of light and be completely consumed in the areas pulsed without propagating the reaction to adjacent areas. The explosive reaction is extinguished immediately upon discontinuance of the radiated light photons. The coating should have high resistance to dissolving effects of the ink, and this may be an inherent property of the coating or the solvent resistance may be enhanced by overcoating the areas remaining on the screen with a lacquer or sealer to improve the resistance to solubility of the coating in the ink formulation.

In order for the film to exhibit these multiple properties, it has been discovered according to the invention that the coating must contain as essential ingredients a combustible film-forming binder, a photothermal pigment, a fuel component, and an oxidizer for the fuel component. The film-forming binder preferably forms a film having a high tensile strength suitably of from about 5000 to 20,000 psi and most preferably, from about 7000 to 15,000 psi. The film desirably exhibits high abrasion resistance and resistance to cracking on flexure such that it exhibits a value for flexure of at least 40 and preferably above 60 on the MIT Folding Endurance Tester. The film must be free from pores which would permit passage of ink through the final coating and must strongly bond to the filaments of the substrate.

The film-forming binder may be either thermoplastic or thermosetting in nature. It is preferably a soluble resin so that the other ingredients of the coating may be worked in by mixing, milling or other slurry or solution procedures to form a uniformly compounded material. If the oxidizer and pigment are not uniformly dispersed throughout the coating, the material will behave very erratically when pulsed with light above the threshold intensity for ignition.

The fuel ingredient will usually be identical with the film-former and is typically the combustible part of the organic resin binder. Though it is considered within the scope of the invention to include additional fuel materials, such as organic combustible materials, to further enhance the combustible nature of the coating, typical binder materials are organic resins having a high percentage of carbon and hydrogen. Preferably, these fuel materials are carbohydrates such as cellulose derivatives, e.g., ethers, esters or nitrates. Other suitable film-forming fuels are polyvinyl alcohol, polyvinyl acetate, vinyl or vinylidine chlorides or fluorides, lactams, polyamides or polycarbonates.

The combustible film is of the low explosive type, that is, a compound that deflagrates by burning over a relatively short but sustained period to convert the fuel and binder component in this period into gaseous by-products. The oxidizers, as used in the invention, are thermally sensitive and when raised to ignition temperature, release free oxygen that combines with hydrogen and carbon or other combustible elements of the fuel to release at a rapid but controlled rate gaseous by-products to eliminate the coating in these areas.

The combustible film may be a mono-propellant type, such as nitrocellulose which acts both as fuel and oxidizer, or the film may be of the composite propellant type such as an organic or inorganic oxidizer compound suspended or dissolved in the organic fuel and film former, such as a nitrate, perchlorate, chlorate, oxide or peroxide. Nitrocellulose is the most preferred material due to its lower temperature of ignition and excellent film-forming properties, but effective films may also be formulated from other explosive materials. The mono-propellant materials can be used in combination by dissolving or suspending particles of one in the other. The inorganic oxidizer for the composite-type fuel is usually an ammonium or alkali metal nitrate, chlorate, perchlorate or peroxide though lower energy oxidizers, such as oxides or chlorates, can be used but require higher power to initiate and ignite the coating.

The photothermal pigment is present uniformly dispersed throughout the coating in an amount sufficient to raise the absorptivity of the coating to a level at which sufficient light energy is absorbed and converted to the thermal threshold for ignition of the coating in a very brief period. Actually, it has been found that the amount present under each unit area of surface is more important than the amount present per unit volume. This is demonstrated by the fact that a coating of a minimum thickness having a certain minimum loading of photothermal pigment will be initiated at the same threshold with the same light pulse when the coating is extended to 3 to 4 times its thickness with a clear, unpigmented film-forming composition.

The pigment may either be consumed by the reaction of the coating or some may remain on the negative as fine powder but is completely removed from the holes through the stencil screen by the force of the combustion gases. The pigments most preferred are those exhibiting the highest absorptivity for broad-band light sources. Black pigments, such as carbon black, having a very high blackness index are very efficient black bodies and absorb broad band radiation and efficiently convert it to thermal energy. Another limitation on the amount of the photothermal pigment is at very high loading, the tendency to propagate the decomposition reaction can be seriously reduced and, in fact, can terminate the reaction before it can penetrate completely through the film since the high density of pigment renders the surface layer fairly opaque, and, therefore, the transmissivity to the underlying portions of the layer is effectively terminated. Since the highly loaded film does not have a high enough thermal conductivity to carry the absorbed surface heat down, the reaction is thermally quenched and does not propagate through the complete thickness of the film.

The pigment may be a dark blue or black organic dye or a dark metal oxide, such as copper oxide, ferric oxide or manganese dioxide. The preferred pigment is a finely divided carbon, such as a photothermal black as contrasted to conductive carbon blacks. The amount of photothermal pigment can be varied over fairly wide ranges, suitably, 2 to 25% by weight and preferably 5to 20% by weight of the film-forming binder. Furthermore, it is preferred to utilize a finely divided carbon black, suitably having an average arithmetic mean diameter of about 10 to 70 millimicrons, suitably 27 millimicrons, so that the finely dispersed particles can act as nucleating agents for the oxidizer component. In the presence of the carbon black, the oxidizer will crystallize during drying of the film into very finely dispersed crystals rather than large aggregate crystals which will tend to disrupt the film and interfere with its combustion properties.

It has been found that the film can have a thickness as low as 0.1 mil and still provide the desired strength characteristics and response to high-intensity, short-duration light. Film thicknesses of over 1 mil are usually not necessary, and as the film thickness increases, the power requirement for the lamp is also raised. The oxidizer is present in sufficient quantity to convert the film-forming binder solids to gases so that the film is completely disrupted in areas exposed to light. Though this is not necessarily a stoichiometric quantity, fairly large levels of oxidizer are present, and it has been found that the ratio of film former to oxidizer should be at least 1:4 to 4:1 by weight and is preferably maintained as low as possible so that the presence of these solids does not interfere with the film properties.

Figure 3:
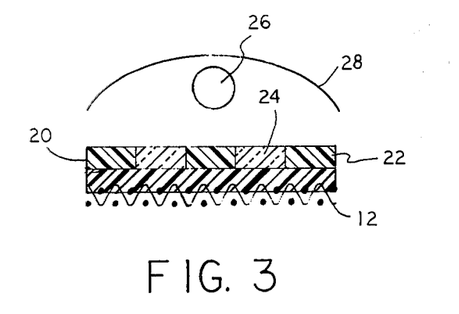
FIG. 3 is a schematic illustration of an arrangement for forming a stencil screen according to the invention.

Referring now to FIG. 3, a printing plate or stencil is prepared in accordance with this invention by placing a transparency 20 having light opaque regions 22 and light transmitting regions 24 in the form of the desired image in between a light source 26 and the coating 18 of the printing stencil blank 10. Suitably, the transparency is placed in direct contact with the coating 18 in order to obtain higher resolution. The flashlamp 26 is provided with a reflector 28, and on pulsing of the lamp to emit a pulse of short-duration, high-intensity light, the light traverses the transparent areas 24 of the transparency, raises the underlying areas of the coating 18 to the threshold of ignition and ignites and consumes these areas during the duration of the pulse of light.

Figure 4:
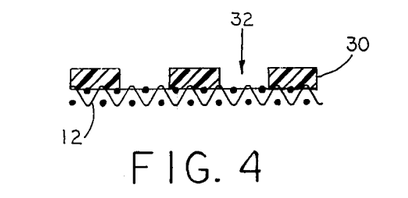
FIG. 4 is a cross-sectional view of a formed stencil screen.
Figure 5:
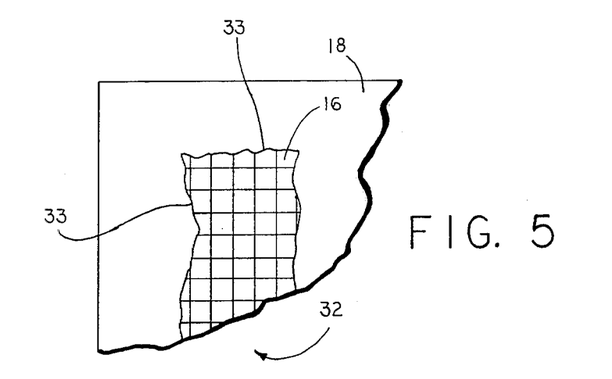
FIG. 5 is an enlarged partial top view of the screen of FIG. 5.

As shown in FIGS. 4 and 5, the substrate has remaining thereon portions 30 of the coating 18 which coincide substantially exactly with the opaque portions 22 of the transparency which did not transmit light, and the areas 32 corresponding to the transparent regions 24 of the transparency have been completely removed. In FIG. 5, an enlarged portion of the finished printing plate obtained in accordance with the invention is illustrated and better shows the selective removal of the coating 18 in the form of the desired image pattern 32. The screen openings 16 through the substrate are visible, and as shown, the resolution is so fine that partial areas 33 of a single square of the screen remain rather than the complete removal of each square of coating 18 as would be expected.

While the transparency has been described in terms of a mask or member having substantially opaque areas and substantially transparent areas, the transparency may have shades of grey which reduces the amount of energy reaching the coating. Ignition, combustion and removal of the coating will be dependent upon whether or not the light energy reaching the coating exceeds the ignition threshold. The transparency can be prepared to have a dot pattern in the well known photographic screen methods to represent shades of grey. The transparency can be a metal member having openings cut out or etched out in the desired pattern or may be formed of any other suitable opaque material having high reflectivity or absorptivity for the lamp light energy and having a high thermal resistance to destruction by said light energy. To obtain the very best resolution, it is preferred that the stencil screen blank and transparency be held in contact under pressure as in a vacuum frame during the period that the short pulse of light is applied to the light-removable coating. The opaque image pattern can also be provided by printing or drawing a pattern onto the film 18 with high reflective compositions, either white or metallic or the film 18 can be coated with silver or aluminum and a reflective pattern formed by conventional photoetching techniques.

The image pattern formed in the transparency or masking member may be in the shape of letters, character symbols, pictures in line, dot or other form. The image may be in either negative or positive form and may be direct reading or reverse reading depending on the desired final use of the printing plate or screen.

The intensity and duration of the photoflash are preferably selected so as to assure photographic grade resolution and fidelity of the final printing screen element. The intensity of the lamp is sufficient to supply enough radiation to the printing screen blank to raise the temperature of the coating to ignition temperature threshold. For example, in the case of a nitrocellulose coating loaded with 10 to 20% of carbon black, the ignition temperature is 190°C and this requires at least about 10 joules per square inch of coating surface. When using contact imaging techniques, the intensity of the flash should not exceed about 100 joules per square inch so that the opaque areas of the masking member are not raised to high enough temperature to deteriorate the ink-impermeable areas of the underlying printing screen. The intensity will be correspondingly higher with films having higher ignition requirements. The duration of the flash pulse can be varied from 0.1 to 50 milliseconds and is preferably from 1 to 5 milliseconds. At shorter pulse duration, it is found that the resolution of the final screen is superior.

One of the principal purposes of the invention is to provide a technique for preparing stencil screens having a quality comparable to fine photograph resolution of at least 100 and preferably up to 400 or more lines per square inch. This criterion can be measured by comparing the line quality of a final printing screen to that of known standards. A further measure of the resolution or fidelity of the final printing screen can be obtained by observing the extent to which grey scale dots of the Bynum Company's Bychrome scale are reproduced.

The light source preferably has a large percentage of visible wavelengths compared to ultraviolet and infrared. This is because the window areas of the transparency and of the glass cover of the vacuum frame have low transmittance to infrared and ultraviolet energy, and therefore, the large visible component is necessary to reach the decomposible coating and raise it to ignition threshold temperature at reasonable power levels. Commercially available electronic flash units can readily be utilized in the practice of the invention. For example, a relatively simple electronic flash unit comprises a Xenon-filled quartz tube which is connected to a large capacitor which is charged from a high-voltage D.C. source. The lamp is fired by discharging a small capacitor through a step-up transformer connected to a third electrode placed around the flash tube. In addition, a pluality of capacitors can be utilized, each of which is charged during operation to 4000 volts or less. The light emanating from this lamp can be varied to have a pulse length of below one millisecond to about 30 milliseconds, and a flash intensity was rated at 500 to 3000 joules.

Although the above has been described with reference to electronic flash units, the present process may likewise be carried out with other sources of short, intense pulses of light including exploding wire sources, spark discharges or magnesium and zirconium flash bulbs. For simplicity and ease of repetition, the electronic system is preferred in the practice of the invention.

DESCRIPTION OF THE PREFERRED EMBODIMENTS

The essential discovery of the invention is the preparation of high strength films of explosive compositions in a manner that they can be decomposed in accurate patterns or images with short pulses of light.

There are three main classes of combustion. The first class of combustible materials are thermally combustible and will not support combustion in absence of continued application of a heat source. The second category of materials are oxidatively combustible and will support combustion in air but will not burn without access to oxygen. The third category of materials are self-combustible. These materials have a built-in supply of oxygen and continue to burn once ignited under most circumstances. The materials of the invention belong to the third class.

It is, in fact, quite remarkable that these self-combustible explosive materials can be ignited for a brief period of time and extinguish the combustion reaction without propagating the reaction laterally to remove the whole film. In initial experiments, a block of black cellulose nitrate approximately ⅛-inch thick and having a 2 inch × 2 inch face was exposed to a pulse from a flash bulb of 30-millisecond duration. Under this illumination, the block completely combusted. When the pulse length of the flash lamp was reduced to the order of 0.2 millisecond, only 0.5 mils of the surface layer of the black nitrocellulose was removed. These experiments were conducted in the open. When a thin film of black nitrocellulose of the order of 0.3 to 0.5 mils is ignited with a match, the thin film burns rapidly and completely in air. Thus, the reason for limitation of propagation of combustion of the illuminated thin film is not that the film is too thin to propagate combustion.

The completely unique and unexpected termination of propagation is caused by other factors. The rate of nitrocellulose combustion is proportional to the pressure at the surface of the burning site. When the black film absorbs the photoflash energy in selected areas, there is an extremely rapid rise in temperature which heats the gas next to the surface even in the absence of combustion and forms a shock wave. After ignition, the gases formed by combustion expand with such a velocity due to this very sudden heating that a partial vacuum is created which is believed to extinguish the combustion. During the same instant, the pulse of radiation has passed the point where it is supplying sufficient energy to maintain combustion, and the nitrocellulose is thus extinguished.

It makes little difference whether this phenomenon is observed at atmospheric pressure in the pressence of oxygen or in a partial vacuum created in a vacuum frame though the presence of the glass plate of the frame in contact with the mask which is in contact with the coating also contributes to limiting propagation of the combustion reaction. In experiments in which the stencil screen blank was held in contact with a transparency by mechanical pressure without the use of a vacuum pump, no observable difference was encountered in the selected decomposition of portions of the coating.

With respect to the thick block experiment, only the outer surface of the block is raised to ignition temperature, and the underlying thick volume is not raised to a temperature sufficient to promote a sustained propagating reaction unless the photoflash energy is continuously projected onto the surface for a time longer than the shock wave to reheat the underlying exposed surface to ignition temperature. Furthermore, with the stencil screens in which the thin film is present on a high void substrate, the screen substrate exhibits a definite inhibiting effect on combustion. However, this cannot be the principal factor since, as described, entire square areas of the screen are not completely burned out. Therefore, the combustion pattern appears to exactly follow the pattern of the projected light.

Those skilled in the propellant art would expect that self-combustible explosive materials having oxidizer distributed throughout the material would continue to burn once ignited. Though it has not been clearly established why the entire coating of the blank stencil does not burn out, the pressure front forming a vacuum is believed to contribute to quenching the reaction. Thus, though the material of the invention usually should be considered a self-combustible ignition-type of material, in the form in which it is used in the invention, it actually behaves more like a thermally combustible material which requires a continuous source of ignition heat to sustain combustion.

These properties and other characteristics of the substrate screens of the invention will now be illustrated in the following detailed description of embodiments of the invention, it being understood that these examples are only offered by way of exemplification and that numerous substitutions, alterations and modifications can readily be made without departing from the scope of the invention.

The coating method can have substantial effect on fidelity, resolution and possibly the threshold voltage of the coated screen. The coating can be applied to the substrate by direct casting or pre-casting methods. With the direct casting methods, the screen is clamped over a support, and the coating is doctored on from the ink side of the screen and allowed to dry. The coating can penetrate the mesh, and the pyrolysis or combustion is influenced to a greater degree by the thermal effect of the filaments. However, in the pre-cast method, the film is formed on a support from which it can be stripped, such as polyethylene, polyesters such as Mylar or glass. When the pre-cast film is transferred to the screen, most of the film is on one side of the mesh, that is, the print side, and thus the mesh will have less influence on the pyrolytic reaction.

EXAMPLE I

A coating having the following composition was coated onto a porous 200-mesh stainless steel screen:

| | |
|---|---|
| 30 second nitrocellulose (12.2% nitrogen) | 100 grams |
| Carbon Black (having a blackness index of 166, and a surface area of 190 sq. meters/gram and a mean particle diameter of 20 m$\mu$) | 5 grams |

The coating was prepared by dissolving the indicated composition in 2,000 grams of commercial lacquer thinner which was then ball milled for 24 hours. Following dissolution and milling, the film was then cast in a wet thickness of 9 mils on a chrome-plated surface in order that the final dry film be approximately 0.0003 inch thick. When the cast film reached a tacky state, the steel screen was firmly pressed down on the nitrocellulose film. Drying continued until the residual solvent was removed, at which point the steel screen, with nitrocellulose film thereon, was peeled from the chrome plate. The coating was then force dried in an oven at a temperature of 140°F for one hour.

Following this, a transparency of the subject matter to be printed was placed in contact with the nitrocellulose film in a vacuum frame and was subjected to photoflash energy of 75 joules per square inch of plate area. The flash lamp, rated at 3000 watt-seconds, was held at a distance of four inches from the nitrocellulose coating and flash duration was 1 msec. The printing plate produced was then used for printing an image of the transparency on a sheet.

EXAMPLE II

| COMPONENT | AMOUNT, g | |
|---|---|---|
| | Dry Basis | Wet Basis |
| DuPont Nitrocellulose (600 to 1000 sec, in 30% ethanol) | 11.5 | 16.6 |
| Hercules Nitrocellulose (35 sec, in 30% isopropanol) | 6.0 | 8.6 |
| Black Nitrocellulose (Coblak Industrial - Columbian Carbon) (12.9 g), consisting of: | | |
| Nitrocellulose (½ sec) | 5.0 | |
| Carbon Black | 5.0 | |
| Plasticizer (Dibutyl phthalate) | 2.9 | |
| TOTAL SOLIDS | 30.4 | |

The dry film comprises 74.0% by weight nitrocellulose, 16.4% by weight carbon black and 9.6 weight per cent dibutyl phthalate.

The following solvent mixtures were prepared:

| COMPONENT | VOLUME, ml | WEIGHT, g |
|---|---|---|
| Part A: Nitrocellulose solvents | | |
| Butyl Acetate | 525.0 | 464.0 |
| Methyl Isobutyl Ketone (4-methyl-2-pentanone) | 70.5 | 56.5 |
| Amyl Acetate | 60.0 | 52.6 |
| Part B: Cosolvents and diluents | | |
| Isopropanol | 278.0 | 217.0 |
| Xylene | 227.0 | 194.0 |
| Toluene | 407.0 | 354.0 |

The solid ingredients of Example II were added to 274 g (325 ml) of Part B and thoroughly stirred for 10 minutes to remove entrained air. Then 211 g (246 ml) of Part A was added and stirred or shaken until solution was complete, usually after 1 to 2 hours, depending on the method of agitation. The solution had a viscosity of 1100 to 1200 centipoises after aging about 48 hours and the composition of the solution was then:

| COMPONENT | WEIGHT, g | WEIGHT % |
|---|---|---|
| Nitrocellulose | 22.5 | 4.30 |
| Carbon Black | 5.0 | .96 |
| Plasticizer | 2.9 | .55 |
| Alcohols from nitrocellulose | 7.7 | 1.47 |
| Solvent | 486.0 | 92.72 |
| | 524.1 | 100.00 |

The diluted solution was cast to a thickness of about 10.0 mil on a 10-mil-thick sheet of polyethylene. After drying, the final film thickness was about 0.3 to 0.4 mil. The polyethylene sheet was cut to the desired size. The coating was then transferred to a stretched screen. The screen was clamped in tight contact with the coated side of the polyethylene sheet. With the film supported on a flat surface, such as a glass plate, a felt or sponge applicator saturated with acetone was drawn across the ink side of the screen. After blowing dry, the polyethylene backing can readily be peeled off and the screen is ready for use. This operation can be conducted in less than a minute.

EXAMPLE III

To establish the voltage threshold limits, a stencil was prepared with the formulation of Example II in which the lacquer was back cast through a stainless steel screen and against a glass plate. The doctor rod used for applying the coating material was placed 4 mils above the screen to give a 4-mil wet thickness of the coating above the mesh. After drying to a dry thickness of about 0.4 mil, the stencil screen was flashed in a vacuum frame adjacent a photographic transparency at four levels of flash intensity. Only partial burn-through was evidenced at 2000 volts on a By Chrome 85-line grey scale. The resolution and intensity of grey increased as the voltage was raised to the levels of 2200, 2400 and 2600 volts. The best prints were made from stencils flashed at the higher voltage. These experiments were all conducted at a constant flash pulse period of 1 millisecond. A series of experiments were then conducted in which the flash duration at the 2600-voltage level was varied from 1 millisecond to 10 milliseconds. It was discovered that at constant voltage, the best burn-out and resolution was obtained at the shorter flash durations of 1 to 5 milliseconds.

To establish the operative limits for the use of photographic transparencies as the image-forming medium, the screen stencil of Example II was placed in a vacuum frame in intimate contact with a photographic film transparency. This assembly was subjected to a photoflash pulse having an energy of 1330 watt-seconds for a duration of 1 millisecond. The energy was confined to a 8½ × 10½ inch area by a semi-cylindrical reflector coated white with a metal oxide pigmented epoxy paint. The reflector held the flashtube three inches from the surface of the vacuum frame. The screen stencil was pyrolyzed in areas corresponding exactly with the transparent areas of the film negative. Areas of the screen stencil coating adjacent to the black areas of the film negative were totally unaffected as were the silver grains forming the black areas.

The experiment was repeated by increasing the energy to 1980 watt-seconds for 1 millisecond. The film was bleached almost white but no emulsion was removed. The film is still capable of being reused in the process of the invention since the white areas still reflect or absorb the energy without transmitting it to the film of the invention.

Another sheet of film was placed 2¼ inch from the light and flashed at 1980 watt-seconds for 1 msec. with no removal of emulsion. Finally, a further piece of film was placed 1¼ inch from the lamp and flashed at 1980 watt-seconds for 1 msec. At this level and distance, some of the dots of the black areas of the film were removed but line images were only partially removed. Since the intensity varies inversely as the square of the distance from the source, the intensity was more than eight times that required in the first experiment to pyrolyze the stencil coating. At the first level at which the coating of the invention is pyrolyzed, the same photographic transparency may be repeatedly exposed and reused to form printing screens and no damage to the transparency or pyrolyzation or adverse reaction of the substrate coating in the areas adjacent to the silver grains will occur.

When the reflector surface was coated with a reflective aluminized polymeric film, the energy requirement for threshold was reduced by factor of 200–300 volts in threshold energy. Using the formula $E = \frac{1}{2} CV^2$, where $E$ is the energy in joules or watt-seconds, $C$ is the capacitance in microfarads and $V$ is the voltage, the pyrolysis reaction requiring 3000 volts with the metal oxide pigmented reflector now requires 2800 volts. This reduces the energy requirement from about 1370 watt-seconds to about 960 watt-seconds representing a 30% decrease in energy.

EXAMPLE IV

The black nitrocellulose solution of Example II was diluted in one part with two parts of a clear nitrocellulose solution having a composition similar to that of Example II except that the 12.9 grams of black nitrocellulose was replaced with 4.5 grams of ½ second clear nitrocellulose. When the film of Example IV was applied to a screen in a wet thickness of 15 to 18 mils, the film exhibited the same sensitivity and threshold to photoflash as the coated screen of Example II. This demonstrates that a film thickness of three times that of Example II will have the same pyrolyzation characteristics since the transmission is constant, that is, as long as the total carbon black content in the film is the same, the film will behave in a similar manner even though the thickness is substantially increased. Therefore, th absorptivity or transmittance of the film is a true parameter for measuring the desired level of loading of the photothermal pigment. Transmittance of the 0.3-mil film attached to a 200-mesh screen was measured by interposing the screen at a distance of 2 inch from a 150-watt tungsten filament G.E. lamp and measuring the transmitted radiation on a Weston Master III light meter. The transmittance measured 25 to 150 units depending on the degree of carbon black dispersed in the film.

Incorporation of plasticizers in an amount of 10 to 20% by weight have been found to improve the flexure properties of nitrocellulose coatings while exhibiting no detectable adverse effect on the pyrolyzation properties of the film. Plasticizers containing halogen and phosphorous should be avoided due to the flame retardant characteristics of these compounds. Preferred plasticizers for nitrocellulose are phthalate esters such as dibutyl phthalate.

A completely esterified cellulose nitrate contains about 14% nitrogen and the cellulose nitrate usually utilized in explosive contains about 13% nitrogen. However, optimum viscosity for handling and the best plastic and film properties are obtained with a nitrocellulose of 600 to 1000 sec. and having a nitrogen content of about 10% to about 12.5% by weight, preferably 10.3% to 12.2% by weight.

Among the highly flammable thermoplastics, cellulose nitrate exhibits excellent toughness, is easy to fabricate, has excellent dimensional stability, resilience and low water absorption. By flammable film former is meant a material that ignites readily and is consumed almost instantaneously by oxidative combustion to completely disrupt the film in areas exposed to light as contrasted with film formers that do not ignite readily and/or burn slowly with dripping, cracking or other mechanism that does not result in removal or disruption of the film or adversely affects adjacent portions of the film.

A measure of flammability of these materials is provided by differential thermal analysis in which the material is heated in a calorimeter to decompositon and ignition at different temperatures over different periods. Differential thermal analysis indicates an ignition temperature of about 190°C for nitrocellulose.

EXAMPLE V

A film stencil was formulated by replacing 15 weight per cent of the nitrocellulose of Example I with nitroglycerin. Nitroglycerin is soluble in nitrocellulose. A wet coating thickness of 4 mils was applied to a 200-mesh stainless steel screen and dried. After drying, the stencil screen was flashed at four voltage levels of 2000 v, 2200 v, 2400 v and 2600 v. Eight distinct shades of grey and very good burn-through at 2000 v were evident. Though the presence of nitroglycerin lowered the flash energy requirement and provided a sharper cut-off point between burn and no-burn, and, therefore, better detail, the pure nitrocellulose material provided a film having superior mechanical properties.

The stencil screens prepared according to the procedures of Examples I and II have been found to print well electrostatically or with wet ink, and metal screens are quickly cleaned by flaming and can be used repeatedly. Resolution as measured on National Bureau of Standards charts show resolutions above 250 lines per inch (1pi) for the stencil, about 225 1pi for the electrostatic print and about 150 1pi for the wet ink print.

The 250-1pi resolution screen of Example II was compared to the best conventional stencil screens available, one prepared by the so-called direct method which is widely used in the industry, and another prepared by the transfer-film method which is used in the industry to obtain the highest resolution and sharpness of line. The stencil prepared according to the invention was prepared by the transfer-film method, was clearly superior to the direct process stencil and was at least equal to the print obtained with the conventional transfer-film specimen. However, as discussed above, the transfer-film specimens of the prior art have poor adhesion. Therefore, they are generally applied to natural silk screen fabric rather than to monofilament. Consequently, the filaments, being of multiple twisted fibers, are not quickly saturated with ink thus leading to the relatively poor quality of the print over the few prints made. Furthermore, the requirement of the conventional transfer film that it be exposed and developed before the transfer to the screen poses a serious handicap in terms of high-quality precision such as is needed in multi-color printing. The other drawback is poor adhesion which limits the type of mesh that can be used and is a severe drawback to the use of the prior art transfer film-type of screen.

Another very important characteristic of the stencil screen of Examples I and II is the excellent resistance it exhibits to water-base inks and conventional oil- and synthetic-base inks. The capability of the nitrocellulose stencil screen in printing with water-base inks was demonstrated by printing copies with water-base inks and then soaking the screen in water for a period of 7 days and again forming prints with the screen. After this treatment, there was no indication of any kind of separation or loss of adhesion due to immersion in water. The print was compared to that of a direct process stencil containing a waterproof emulsion, and both screens were printed with a water-soluble aqua poster screen printing ink (Black Pak-700, Advance Process Supply Co.). The screen according to the invention exhibited better print copy. The direct process screen accentuated the inherent faults of the direct process method in regard to sharpness and resolution.

The nitrocellulose stencil screen does not exhibit sufficient resistance to lacquer-base inks. These inks constitute only a very small portion of use in the industry and, in any case, a composition resistant to lacquer-base inks can be formulated according to the invention. The lacquer-resistant formulation is based on one of the composite-type of materials, that is, one containing a separate oxidizer dispersed throughout the film former-fuel coating.

EXAMPLE VI

The following composition was prepared and coated on 305-mesh nylon screen:

| COMPONENT | AMOUNT, g. |
|---|---|
| Dow Methocel (methyl-cellulose) | 0.79 |
| Potassium Nitrate ($KNO_3$) | 1.77 |
| Carbon Black | 0.60 |
| Distilled Water | 50.00 |

The mixture was milled overnight without the potassium nitrate. Potassium nitrate was then added, and the mixture was milled for another 6 hours. The resulting composition was then coated by conventional screen stencil coating techniques on the 305-mesh nylon screen. Two coats were applied with a scoop coater, air drying between coats. When the composition was prepared without the carbon black, the potassium nitrate crystallized to form large crystal which disrupted the film. When the carbon black is milled into the mixture, there is no evidence of segregation, and this demonstrates the nucleating effect of the carbon particles which act as crystallization centers for the potassium nitrate to promote formation of finely divided potassium nitrate crystals thoughout the film. The crystal growth may also be controlled by the addition of small quantities of crystal growth inhibiting material, such as finely divided silica to act as nucleating centers. Alternatively, when water is used as the solvent for the film former, water-insoluble oxidizers, such as lead oxide, manganese dioxide and silver oxide, could be preground and incorporated into the formulation.

EXAMPLE VII

The following composition was prepared and coated onto a 200-mesh stainless steel screen:

| COMPONENT | AMOUNT, g. |
| --- | --- |
| Methyl Cellulose (400 cps, Dow) | 1.54 |
| Carbon Black (Excelsior) | 1.20 |
| $KNO_3$ (200-mesh) | 3.54 |
| Water | 100.00 |

The methyl cellulose, carbon black and water were ball milled for 20 hours, then the potassium nitrate was added and milling was resumed for an additional 6 hours. The slurry was back-coated to a 4-mil wet thickness on the stainless steel screen and allowed to dry. The screen was flashed at various energy levels and a cut-off level of about 3250 volts at 1 msec. was established when the stencil was held in a Polycop vacuum frame. On differential thermal analysis, the potassium nitrate-Methocel mixture ignited at a temperature of about 375°C. This material ignited substantially as easily as the nitrocellulose film of Example II. The differential thermal analyses further indicated that the self-sustained combustion of oxidizer-fuel mixture closely follows the melting point of the oxidizer. The stencil prepared in Example VII was utilized in an electrostatic screen printing process and produced prints having a relative resolution of about 125 lpi.

EXAMPLE VIII

The formulation of Example VII was modified by decreasing the amount of water and carbon black by 50%. This formulation was ball milled for 45 hours and cast onto a polyethylene film by use of a No. 10 wire wound doctor rod. The dry film thickness was approximately 0.3 mil. The film was attached to a 200-mesh stainless steel stencil screen by a water transfer procedure. After drying, the film was flashed at 3200 volts for one millisecond. A good stencil resulted and prints of acceptable quality were produced with lacquer-based inks.

This formulation was modified by replacing the potassium nitrate with an equivalent weight of ammonium nitrate. Good films were produced which readily pyrolyzed under the same conditions to form stencil screens. The film of this example was found to have a higher sensitivity to threshold but was found to be somewhat more sensitive to high relative humidity during storage.

EXAMPLE IX

A further composite propellant composition based on ethyl cellulose having the following composition was prepared and coated onto a 200-mesh stainless steel screen:

| COMPONENT | AMOUNT, g. |
| --- | --- |
| Ethyl cellulose (EC N-300, Hercules Ink) | 14.0 |
| Toluene (Technical grade) | 160.0 |
| Ethanol (190 proof) | 40.0 |
| Carbon Black (Columbian Carbon Co., Excelsior) | 10.9 |
| $KNO_3$ (200-mesh) | 24.7 |
| Naphtha | 70.0 |

All ingredients except the potassium nitrate were shaken together for ¼ hour on a paint shaker, then ball milled for 20 hours. The potassium nitrate was added and milling was continued for an additional 3 hours. A 4-mil wet film was backcast onto a stainless steel screen adjacent a glass plate. Release from the glass plate was obtained by wetting the film with naphtha. The dried stencil was pyrolyzed at 3500 volts for 1 millisecond. Prints made by electrostatic means had a resolution of 125 lines per inch.

EXAMPLE X

A further composite propellant-type of formulation comprising ammonium perchlorate and methyl cellulose was cast onto a 200-mesh stainless steel screen. Step 1: A black methyl cellulose film was cast 24 mils wet (about 0.4 mil dry) onto 10-mil polyethylene sheet. The composition consisted of the following:

| COMPONENT | WEIGHT |
| --- | --- |
| Methyl cellulose (Dow Methocel HG-type 65HG Standard - 4000 cps) | 11.8 g |
| Aquablack K | 7.8 g |
| Water | 700.0 ml |

"Aquablack K" is an aqueous dispersion containing a non-ionic wetting agent and consists of 30% Raven 15 carbon black. Raven 15 grade has a mean particle diameter of 27 millimicrons and a specific surface of 145 m²/g.

The methyl cellulose was dispersed in one-third the total water which was first brought to boiling before adding the methyl cellulose. After a smooth dispersion was formed, the balance of the water (cold) was added with stirring. The solution was then cooled 5–10°C to achieve complete solution and clarity. Then the Aquablack K was added, and the mixture was allowed to warm to room temperature. Stirring was continued for 1 hour to insure complete homogeneity.

Step 2: After the film was dried on the support, a 10 × 14 inch I.D. screen process stencil frame with tautly stretched 200-mesh stainless steel screen fabric was clamped in tight contact with the film on the "print side", i.e. the side that will be next to the material to be printed.

Ammonium perchlorate in aqueous solution appears to adversely affect the methyl cellulose and on solidifying tends to recrystallize in coarse crystals which affect resolution and uniform combustion. This can be minimized by encapsulating the oxidizer grains in a metal soap or a wax such as carnauba wax.

Step 3: The following water-repellent oxidizer composition was quickly mixed and blade coated 2 mils above the screen on the "ink side", i.e., the side of the stencil which will receive the ink.

| | |
|---|---|
| Ammonium Perchlorate (coated with a thin film of ferric stearate)- 325-mesh | 2.5 grams |
| Black Methyl Cellulose film composition (described in Step 1) | 15.0 grams |

The encapsulated grains were prepared by adding to the grains 1% of the weight of oxidizer of ferric stearate dissolved 10 ml Xylol and evaporating to dryness on a water bath with continuous stirring.

After coating, the film was force dried with a hot air gun until nearly dry; cool air was then applied until fully dry. Residual moisture was removed by heating 30 minutes at 102°C. The polyethylene support was then peeled from the screen.

A photographic negative transparency with a reversed image, i.e., "right-reading" when viewed from the emulsion side, was placed in the vacuum frame and exposed to flash energy at 1150 watt-seconds. The resultant stencil possessed excellent resolution and printed lacquer-and oil-base inks without dissolving or detectable deterioration.

The film of Example X combined the excellent film properties of methyl cellulose with the oxidizer properties of $NH_4ClO_4$ without diminishing the former. In effect, the methocellulose film is heated to the point of combustion with the underlying adjacent oxidizer-rich adhering film. The ratio of total film former (methyl cellulose) to oxidizer in the foregoing example was approximately 1:2.5 by weight.

What is claimed is:

1. A blank for forming a printing screen comprising in combination:
   a flexible, porous substrate having a high tensile strength and having openings which extend between opposite faces and of a size to permit passage of ink therethrough;
   a thin film on said substrate having high flexural and tensile strength, said thin film being uniform in cross section and including a combustible film former composed of an organic resin having a high percentage of hydrogen and carbon, a solid oxidizer uniformly dispersed throughout said film, and a fuel component, being resistant and impervious to said ink, said film being self-combustible, having a light-absorbing pigment in sufficient quantities per unit of surface area of said film to be ignitable and completely consumed in selected areas directly exposed to a high-intensity, short-duration pulse of light which raises the thin film to ignition threshold.

2. A blank according to claim 1 in which said oxidizer is an alkali metal or ammonium compound of a member selected from nitrates, oxides, chlorates, perchlorate, peroxides.

3. A blank according to claim 1 in which the weight ratio of film former to oxidizer is from 1:4 to 4:1.

4. A blank according to claim 1 in which said film-forming binder is methyl cellulose, said ratio is 1:3 to 2:1 and said oxidizer is selected from ammonium perchlorate and potassium nitrate.

5. A printing screen blank comprising in combination:
   a mesh substrate having a mesh size of from 100 to 400 mesh, said substrate having high tensile and flexural strength and being woven from plastic or metal materials; and
   a light energy-absorbent, self-combustible thin film attached to said substrate comprising a film of a nitrocellulose containing about 10 to 12.3% by weight nitrogen and containing 10 to 20% by weight of a light absorbing pigment.

6. A printing screen blank comprising in combination:
   a mesh substrate having a mesh size of from about 100 to 400 meshes per linear inch, said substrate having high tensile and flexural strength;
   a light energy-absorbent, self-combustible 0.1- to 1-mil-thick film attached to said substrate comprising a lower alkyl cellulose ether containing an intimate dispersion of 10 to 20% by weight of carbon black and of an alkali metal or ammonium nitrate or perchlorate.

* * * * *